United States Patent [19]

Brown

[11] 4,221,182
[45] Sep. 9, 1980

[54] FLUIDIZED BED GAS COATING APPARATUS

[75] Inventor: Lloyd C. Brown, San Diego, Calif.

[73] Assignee: General Atomic Company, San Diego, Calif.

[21] Appl. No.: 904,548

[22] Filed: May 10, 1978

Related U.S. Application Data

[63] Continuation of Ser. No. 730,235, Oct. 6, 1976, abandoned.

[51] Int. Cl.² .................... C23C 11/00; C23C 13/08; G21C 3/06
[52] U.S. Cl. .............................. 118/716; 118/DIG. 5; 427/6; 427/213
[58] Field of Search .................................. 118/48–49.5, 118/DIG. 5, 308; 427/6, 21, 50, 51, 124, 212, 213; 34/57 A; 176/915 P; 422/143

[56] References Cited

U.S. PATENT DOCUMENTS

| 3,215,508 | 11/1965 | Piester | 422/143 |
| 3,251,337 | 5/1966 | Latta et al. | 427/213 X |
| 3,370,361 | 2/1968 | Guerrieri | 34/57 A X |
| 3,398,718 | 8/1968 | Pilloton | 118/48 |
| 3,565,593 | 2/1971 | Moore, Jr. | 422/143 X |
| 3,566,830 | 3/1971 | Flamm | 118/48 |
| 3,636,923 | 1/1972 | McCreary et al. | 118/DIG. 5 |
| 3,822,140 | 7/1974 | Gyarmati et al. | 118/DIG. 5 |

*Primary Examiner*—Morris Kaplan
*Attorney, Agent, or Firm*—Fitch, Even & Tabin

[57] ABSTRACT

Apparatus for suspending particles in a fluidized bed within a coating chamber where the particles are coated with a substance contained in a reactant gas introduced into the chamber by means of a centrally arranged nozzle extending upwardly from the coating chamber floor. Levitating gas for suspending the particles in the fluidized bed is introduced into the chamber from around the centrally arranged nozzle and generally parallel with the chamber base to promote particle circulation through the fluidized bed and minimize deposition within the chamber in one species of the apparatus, the nozzle is supported upon a movable probe which forms a closure for an opening in the chamber base through which coated particles are unloaded.

6 Claims, 4 Drawing Figures

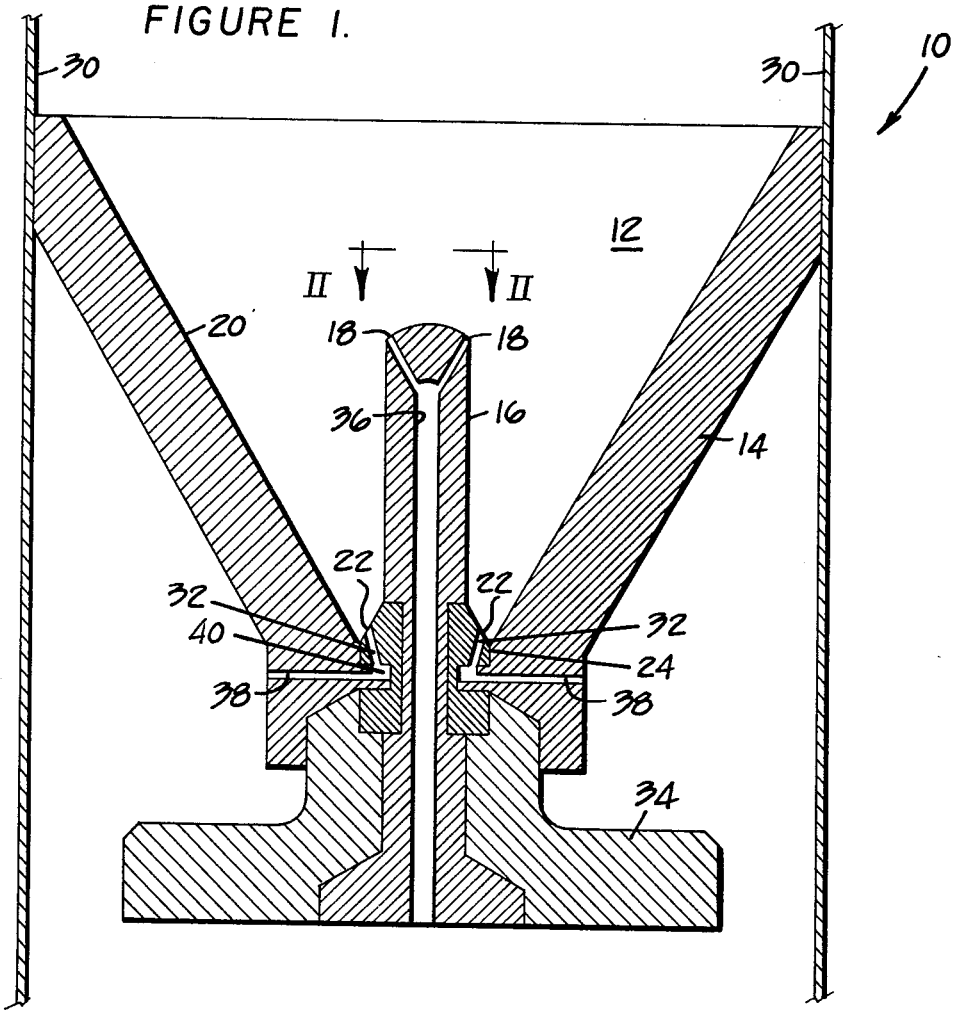

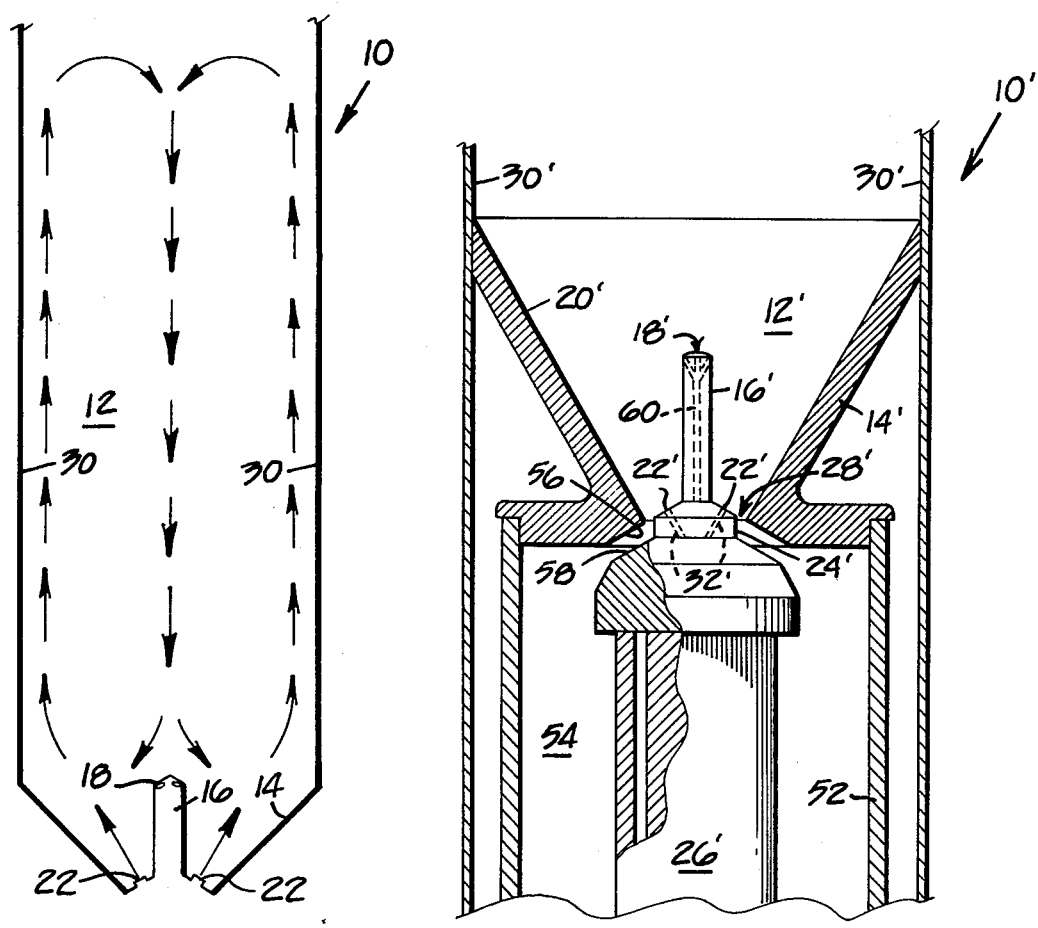

FLUIDIZED BED GAS COATING APPARATUS

This is a continuation of application Ser. No. 730,235, filed Oct. 6, 1976, now abandoned.

BACKGROUND OF THE INVENTION

The present invention relates to apparatus for fluidizing a particle bed during gas coating and more particularly to such apparatus where the fluidized bed is developed by the introduction of levitating gas flow.

It is well known in the prior art to employ gas coating within a fluidized bed for coating particles and other objects immersed in the bed. The coating may be formed by the decomposition, polymerization, condensation and/or chemical reaction of a gas, vapor or gas-vapor mixture. As a particular example of such a process, hydrocarbon products are commonly applied in such a coating process to provide protection for nuclear fuel particles of a type used in nuclear reactors. The fuel particles are small, for example, on the order of 500 microns and may be formed from a suitable fissile and/or fertile material, such as uranium, plutonium, thorium or suitable compounds of such materials.

Within a nuclear reactor, the fuel particles are exposed to conditions of high temperature and severe irradiation over prolonged periods of operation. In order to assure continued effectiveness under these conditions, it has become common practice to coat the fuel particles with an impermeable material in order to retain gaseous and metallic fission products within the individual particles.

Pyrolytic carbon and metallic carbide are specific examples of materials composing such coatings for nuclear fuel particles. The coatings may be applied at high temperature through the introduction of a reactant gas including or consisting of a suitable hydrocarbon such as acetylene, propylene, propane or methane. The desired coating is deposited through the high temperature decomposition of the hydrocarbon gas.

Examples of fuel particles provided with such coatings are disclosed and set forth for example in U.S. Pat. No. 3,325,363 issued June 13, 1967 to Goeddel et al.; U.S. Pat. No. 3,298,921 issued Jan. 17, 1968 to Bokros et al.; U.S. Pat. No. 3,361,638 issued Jan. 2, 1968 to Bokros et al.; and U.S. Pat. No. 3,649,452 issued Mar. 14, 1972 to Chin et al.

When the particles being coated are relatively small, the coating operation may be efficiently carried out with the particles suspended in the form of a fluidized bed within a high temperature coating chamber. Levitation of the particles within the fluidized bed may be achieved through the controlled introduction of a hydrocarbon gas, an inert carrier gas or a combination thereof into the coating chamber for dispersion through the particle bed. Most commonly, an inert carrier gas such as argon, helium, nitrogen or hydrogen is employed for this purpose.

In a coating chamber for carrying out such a coating operation, the particles are dispersed and suspended by means of the levitating gas in order to form the fluidized bed. A reactant gas is introduced by a nozzle and decomposed at high temperatures within the coating chamber in order to deposit the coating material upon the particles. Various conditions for carrying out such a coating operation are believed to be well known in the prior art including temperature ranges within the coating chamber as well as rates and pressures under which both the reactant and levitating gases may be introduced into the chamber as well as the duration of the coating operation.

High temperature gas coating operations employing fluidized beds of particles are relatively complex and may accordingly involve numerous problem areas. In particular, it has been found that a substantial deposition or buildup of carbonaceous material occurs upon internal surfaces of the chamber during decomposition of the reactant gas within the high temperature environment. Carbon buildup is a particular problem when it tends to disrupt the proper introduction of reactant or levitating gases or to interfere with the circulation of particles throughout the bed or the removal of coated particles from the chamber. When the reactant gas is introduced into the coating chamber by means of a nozzle extending upwardly from a central portion of the coating chamber base, severe deposition tends to develop upon the floor of the coating chamber. Carbon buildup in this location particularly interferes with the unloading of the coated particles from the chamber by means of an opening in the chamber floor.

An additional problem area of particular note in relation to the present invention involves the need for maintaining uniform distribution and circulation of particles throughout the fluidized bed. These factors are especially important in developing uniform coating of entire particle batches in the coating chamber.

Accordingly, there has been found to remain a substantial need for improved apparatus for dispersing and suspending particles in a fluidized bed during gas coating.

SUMMARY OF THE INVENTION

It is accordingly an object of the present invention to provide improved apparatus for suspending particles in a fluidized bed during gas coating while overcoming one or more problems of the type referred to above.

It is a more specific object of the invention to provide such apparatus wherein a reactant gas is introduced by nozzle means extending upwardly from the chamber floor, a levitating gas being introduced in a manner to sweep the surface of the chamber floor in order to prevent the deposition of carbonaceous material thereupon.

It is also a more specific object of the invention to provide such apparatus wherein a reactant gas is introduced by such a nozzle means while a levitating gas is introduced in a manner selected to accomplish uniform distribution of particles within a fluidized bed and to promote uniform circulation of the particles within the bed.

It is an even more specific object of the invention to provide such apparatus wherein a levitating gas is introduced through a plurality of orifices arranged about a centrally located nozzle means, the levitating gas emanating from the orifices generally parallel to the chamber floor with a swirl effect for promoting uniform particle distribution through the fluidized bed.

Yet another specific object of the invention is to provide gas coating apparatus of the type referred to above wherein reactant gas is supplied to the nozzle means and levitating gas is supplied to the orifices through a probe means which is retractable to provide an opening for unloading coated particles from the chamber.

Additional objects and advantages of the invention are made apparent in the following description having reference to the accompanying drawings.

BRIEF DESCRIPTION OF THE DRAWINGS

FIG. 1 is an axially sectioned view of a gas coating chamber embodying the apparatus of the present invention.

FIG. 2 is a view taken along section line II—II of FIG. 1.

FIG. 3 is a representation of a gas coating chamber illustrating particle flow within the coating chamber.

FIG. 4 is an axially sectioned view of another embodiment of a gas coating chamber embodying the present invention.

DESCRIPTION OF THE PREFERRED EMBODIMENTS

Generally, the present invention relates to apparatus for suspending particles in a fluidized bed during a gas coating operation in order to uniformly coat the particles with a component from a suitable reactant gas. Gas coating apparatus according to the present invention is generally indicated at 10 in FIG. 1 and includes a coating chamber 12 having a base or floor 14. A nozzle 16 is centrally arranged relative to the chamber floor 14 and extends upwardly from a central portion of the chamber floor to form an outlet 18 for introducing reactant gas into the coating chamber 12.

The floor 14 of the coating chamber is preferably an inverted conical member as illustrated in FIG. 1. However, the present invention is not limited to a coating chamber having such a cylindrical configuration or a conical shaped floor. For example, the floor 14 for the coating chamber could be of a hemispherical or even a flat surface configuration. The configuration of the floor 14 for the coating chamber and particularly its upper surface 20 forming an interior surface portion of the chamber 12 is of importance in connection with the introduction of levitating gas as described immediately below.

Levitating gas for promoting suspension and circulation of particles within a fluidized bed in the coating chamber 12 is introduced into the chamber through orifices 22 formed by an orifice ring 24 arranged about the base of the upwardly extending nozzle 16. The orifices 22 are arranged to direct levitating gas radially outwardly and generally in parallel relation with the surface 20 for the chamber floor 14. Such an arrangement is illustrated in FIG. 1. In addition, the orifices 22 are also arranged in radially offset relation as may be best seen in FIG. 2 to promote a swirling motion of the levitating gas in order to more effectively sweep the surfaces 20 of the chamber floor 14. The swirling action of the levitating gas is contemplated to eliminate dead areas adjacent the surface 20 where particles from the chamber 12 could otherwise settle out during a coating operation and collect upon the surface 20 of the chamber floor.

As may be best seen in FIG. 1, the orifices 22 are directed at a slight upwardlangle relative to the surface 20 of the chamber floor. Referring also to FIG. 3, the introduction of levitating gas into the coating chamber through the orifices 22 arranged about the base of the nozzle 16 facilitates distribution of particles throughout the entire coating chamber 12. Thus, use of the orifice ring 24 also contributes to more uniform coating of particles within the chamber 12 since it promotes circulation of the particles throughout the chamber while tending to maintain motion of the particles within the chamber throughout the fluidized bed.

Another embodiment of the coating apparatus, indicated at 10' in FIG. 4, includes a generally similar combination of elements as summarized above. Elements in the embodiment of FIG. 4 are identified by primed numerals corresponding to the similar elements employed in FIG. 1. In FIG. 4, however, the nozzle 16' and orifice ring 24' are mounted upon a movable probe 26 which serves a number of functions. The probe 26 includes passage means for communicating reactant gas to the nozzle 16' and for communicating levitating gas to the orifice ring 24'. At the same time, the probe may be retracted or shifted downwardly in order to provide an annular opening 28 at the apex of the conical chamber floor 14' for unloading coated particles from the coating chamber 12'.

The features of the coating apparatus 10 of FIG. 1 and the coating apparatus 10' of FIG. 4 are set forth in greater detail along with a description of a preferred method of operation.

Referring now to FIG. 1, the coating chamber 12 may preferably be arranged within a reactor vessel including vertical walls 30, the reactor vessel being suitable for disposition within a high temperature furnace (not otherwise shown).

The inverted conical chamber floor 14 has an included angle within the general range of 30° to 140°. Preferably, the included angle of the conical member 14 is selected within the range of approximately 45° to approximately 90°. In both of FIGS. 1 and 4, the conical member is illustrated with a 60° included angle.

The nozzle 16 extends upwardly with its outlet 18 arranged substantially above at least a central portion of the internal surface 20 for the chamber floor 14. The orifice ring 24 includes a number of internal passages 32 which are in respective communication with the orifices 22. A base member 34 forms a passage 36 for communicating reactant gas to the nozzle 16. Similarly, the apex portion of the chamber floor 14 forms passages 38 for communicating levitating gas to the passages 32 and the orifices 22. As may be seen in FIG. 1, an annular chamber 40 communicates the inlet passages 38 with the various passages 32 which lead to the orifices 22.

Referring also to FIG. 2, it may be seen that the passages 32 are offset so that the flow of levitating gas from the orifices 22 includes a swirl effect adjacent the surface 20 of the chamber floor 14. Preferably, the passages 32 are radially offset with each of the passages 32 also forming an angle of approximately 15° relative to the surface 20 of the chamber floor 14. In this manner, levitating gas introduced into the coating chamber 12 from the orifices 22 tends to completely sweep the surface 20 and prevent particles within the chamber 12 from depositing thereupon. At the same time, the levitating gas introduced into the coating chamber 12 through the orifices 22 tends to promote more uniform circulation of particles throughout the fluidized bed occupying the lower portion of the coating chamber 12 as may be best seen in FIG. 3. Referring to that figure, the levitating gas from the orifices 22, illustrated by series of arrows, tends to flow outwardly along the surface 20 of the chamber floor 14 and then upwardly along the walls 30 of the chamber 12. In the upper portion of the bed, the particles tend to converge toward an axially central portion of the chamber and to flow downwardly toward the nozzle. In this manner the particles tend to follow the pattern of circulation illustrated in FIG. 3. At the same time, reactant gas being introduced into the chamber 12 through the nozzle 16 is permitted to uniformly interact with the particles in order to promote more even deposition of coating material upon the particles.

As was noted above, the coating apparatus of FIG. 4 is substantially similar to that of FIG. 1 as described above except that its nozzle 16' and orifice ring 24' are mounted upon the movable probe 26 in order to facilitate unloading of coated particles from the chamber 12'. Accordingly, the chamber floor 14' is rigidly mounted within the walls 30' by means of a sleeve 52. An annular passage 54 is formed between the sleeve 52 and movable probe 26 for receiving coated particles from the chamber 12'. For communicating the coated particles to the passage 54, the conical member 14' is formed with a conical surface 56 at its apex, the surface 56 tapering downwardly and outwardly in order to mate with a conical surface 58 on the probe 26. With such a configuration, the probe 26 may be shifted upwardly so that the tapered surface 58 mates with the opening 56 to close the bottom or apex of the conical floor 14'. However, after completion of a coating operation, the movable probe 26 may be shifted downwardly, for example by means of a drawbar (not shown), in order to form the opening 28 through which the coated particles may be unloaded from the coating chamber 12'.

As in the embodiment of FIG. 1, the orifice ring 24' includes a number of passages 32' of generally similar configuration as illustrated in FIG. 2 for communicating levitating gas to the orifices 22'. Similarly, the nozzle 16' includes an axially extending passage 60 for communicating reactant gas to the nozzle outlet 18'.

Reactant gas is communicated to the nozzle passage 60 and levitating gas is communicated to the passages 32' by means of conduits formed within the movable probe 26. Thus, the design and configuration of the coating chamber of FIG. 4 facilitates the communication of both reactant and levitating gases into the chamber 12' while readily permitting unloading of coated particles from the chamber 12' at the apex of the conical member 14'.

Additionally, the movable probe 26 may be retracted or shifted downwardly to permit replacement of either the nozzle 16' or the orifice ring 24' for example in the event of excessive carbonaceous buildup on either of those components. Otherwise, operation of the coating apparatus 10' of FIG. 4 is substantially identical to that described above for the apparatus of FIG. 1 with reference also to FIGS. 2 and 3.

Accordingly, a particularly effective method and apparatus for suspending particles in a fluidized bed during gas coating of the particles has been described. Additional variations besides those described above are believed to be obvious within the scope of the present invention which is defined only by the following appended claims.

What is claimed is:

1. Gas coating apparatus for coating particles with a substance contained in a reactant gas while the particles are suspended in a fluidized bed by means of a levitating gas, comprising
    means defining a generally cylindrical chamber for containing the particles to be coated,
    an inverted conical member having a downwardly extending apex forming a base for said coating chamber,
    a single elongated nozzle extending upwardly from the apex of said conical member and having an outlet at its upper end substantially spaced apart from the chamber base and centrally located in the coating chamber for introducing the reactant gas into the coating chamber, and
    means at the base of the nozzle forming a plurality of circumferentially spaced apart outlet orifices for introducing levitating gas into the chamber, said orifices being arranged in radially outwardly facing relation to direct said levitating gas radially outwardly and generally parallel with said conical base member in order to sweep the surface of the conical member with said levitating gas.

2. The gas coating apparatus of claim 1 wherein said orifice forming means includes a number of internal passages in respective communication with said outlet orifices, said passages being arranged in radially offset relation so that levitating gas is introduced through said orifices into said coating chamber with a swirling motion.

3. The gas coating apparatus of claim 1 adapted for the high temperature gas coating of nuclear fuel particles, the means defining the cylindrical coating chamber forming a reaction chamber for a high temperature furnace.

4. A high temperature, fluidized bed, gas coating apparatus for coating particles with a substance contained in a reactant gas while the particles are suspended in a fluidized bed by means of levitating gas flow and thereafter unloading the coating particles from the coating chamber, comprising,
    means defining a generally cylindrical high temperature coating chamber for containing the particles to be coated,
    means forming a floor for said coating chamber with a centrally arranged opening,
    movable probe means including a surface portion arranged for closing engagement with the opening of said floor, said probe means being movable in order to form an annular opening for unloading coated particles from said chamber,
    nozzle means for introducing reactant gas into the coating chamber being arranged upon said movable probe and extending upwardly therefrom to form an outlet in substantial spaced apart relation from the chamber floor for said reactant gas, and
    means also arranged upon said movable probe and forming a plurality of orifices for directing levitating gas into said coating chamber along paths generally parallel with said floor in order to sweep the floor with said levitating gas, said movable probe including means for communicating reactant gas to said nozzle and for communicating levitating gas to said orifices forming means.

5. The gas coating apparatus of claim 4 wherein said orifice forming means includes a number of internal passages in respective communication with said outlet orifices, said passages being arranged in radially offset relation so that levitating gas is introduced through said orifices into said coating chamber with a swirling motion.

6. The gas coating apparatus of claim 4 adapted for the high temperature gas coating of nuclear fuel particles, the means defining the cylindrical coating chamber forming a reaction chamber for a high temperature furnace.

* * * * *